United States Patent
Skog

(10) Patent No.: US 6,219,035 B1
(45) Date of Patent: Apr. 17, 2001

(54) APPARATUS PANEL

(75) Inventor: Göran Skog, Bromma (SE)

(73) Assignee: Siemens Elema AB, Solna (SE)

( * ) Notice: Subject to any disclaimer, the term of this patent is extended or adjusted under 35 U.S.C. 154(b) by 0 days.

(21) Appl. No.: 09/179,086

(22) Filed: Oct. 27, 1998

(30) Foreign Application Priority Data

Nov. 25, 1997 (SE) .................................................. 9704330

(51) Int. Cl.⁷ ....................................................... G09G 5/08
(52) U.S. Cl. ........................... 345/161; 345/164; 345/173; 345/174; 345/184
(58) Field of Search ..................................... 345/161, 164, 345/165, 173, 174, 184; 200/5 R

(56) References Cited

U.S. PATENT DOCUMENTS 4,233,593 11/1980 Bigelow .

5,859,631 * 1/1999 Bergman et al. ..................... 345/173
5,977,955 * 11/1999 Jaeger ................................... 345/172

FOREIGN PATENT DOCUMENTS 0 725 482 1/1996 (EP) .
0 782 091 11/1996 (EP) .

* cited by examiner

Primary Examiner—Richard Hjerpe
Assistant Examiner—Jean Lesperance
(74) Attorney, Agent, or Firm—Schiff Hardin & Waite

(57) ABSTRACT

An apparatus panel for placement at least partially in front of a screen or display or over a printed surface, has at least two stacked, transparent panel plates, a mechanical user interface in the form of at least one mechanically actuated regulating arrangement and a corresponding contact arrangement. In order to reduce the risk of leakage into the panel, the panel is devised so that regulating arrangement and the contact arrangement are physically separated by at least one of the panel plates and can sense each other's relative positions and, accordingly, the mechanical user interface's setting, without touching.

8 Claims, 2 Drawing Sheets

APPARATUS PANEL

BACKGROUND OF THE INVENTION

1. Field of the Invention

The present invention is directed to an apparatus panel, and in particular to a panel for an apparatus which is used in an environment wherein the panel may be subject to fluid or moisture entering into the panel.

2. Description of the Prior Art

Swedish Patent 504 758 describes a transparent apparatus panel suitable for placement on e.g. a screen. The panel is composed of multiple layers or plates. A mechanical control means is arranged in the panel for setting parameters or the like. The control means passes through the outer panel plate to act on opposite contact means inside the panel. The opening through the outer plate is sealed to keep fluid or moisture from entering into the panel and affecting settings.

One problem with this apparatus panel is the ever present risk of leakage, even though seals are arranged around the openings. Mechanical damage and ear could still lead to the intrusion of moisture or fluid.

Another problem is that the panel, as a result of the openings, has a fixed geometry. This necessitates manufacturing a number of different panel types (with different constellations of mechanical setting means) to accommodate different applications.

SUMMARY OF THE INVENTION

It is an object of the present invention to provide an apparatus panel which is able to be used in an environment wherein fluid or moisture is present. A further object of the present invention is to provide an apparatus panel which can be manufactured in a single, generic format and which can be modified to adapt to different applications.

These objects are achieved in accordance with the principles of the present invention in an apparatus panel adapted for placement at least partially in front of a screen or a display, or over a printed surface, having at least two stacked, transparent panel plates, a mechanical user interface in the form of at least one mechanically operated regulating arrangement and a corresponding contact arrangement, wherein the regulating arrangement and the contact arrangement are physically separated from each other by one of the panel plates, and are capable of sensing each other's relative positions without touching (i.e., without physical contact between the regulating arrangement and the contact arrangement. By virtue of being able to sense each other's relative positions without physical contact, the setting of the mechanical user interface, by means of the regulating arrangement, can be sensed by the contact arrangement.

By making the panel with an unperforated plate and a regulating arrangement and contact arrangement capable of sensing each other's respective positions without touching, the risk of leakage can be completely avoided. This design also makes it possible to place more (transparent) contact arrangement in the panel and to position detachable regulating arrangement over the contact arrangement as is appropriate at any given moment.

Touch-free actuation can be achieved by capacitive, magnetic, optical or acoustical transmission through the unperforated plate.

DESCRIPTION OF THE PREFERRED EMBODIMENTS

Figure 1:
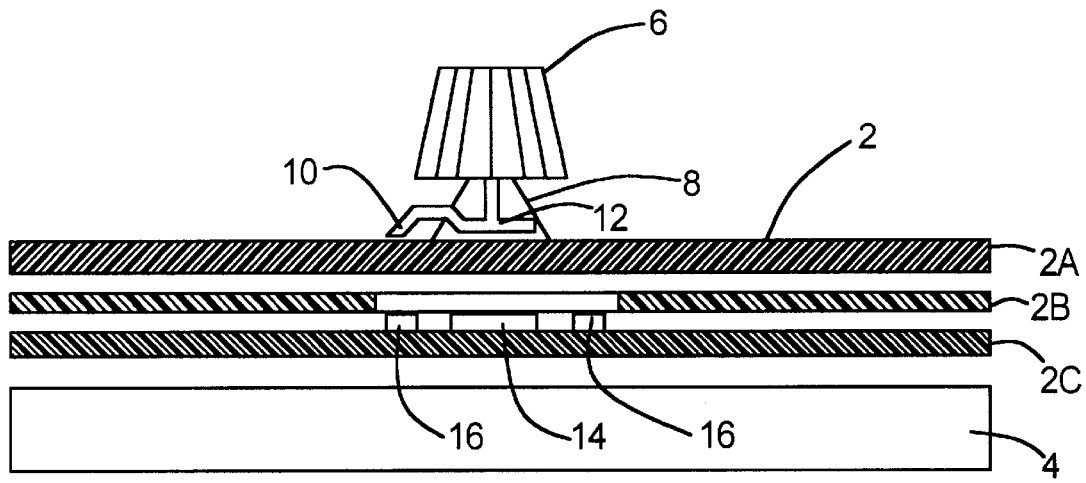
FIG. 1 shows the structure of the apparatus panel according to the invention.

FIG. 1 shows an apparatus panel 2 which, in this instance, is composed of three layers or plates 2A, 2B, 2C. The first plate 2A can be made of thin glass or plastic, the second plate 2B can be made of a thin protective layer (or foil) with some openings to prevent electromagnetic interference and the third plate 2C can be made of a thin carrier plate on which electrical conductors are arranged. Other configurations are possible, with regard to the number of plates or layers and their respective purposes. The previously cited Swedish Patent 504 758 describes the different layers of the panel in greater detail. The advantages and purpose of placing the transparent apparatus panel 2 in front of a screen 4 or some other image/text (indicia-carrying) surface are also described.

Figure 2:
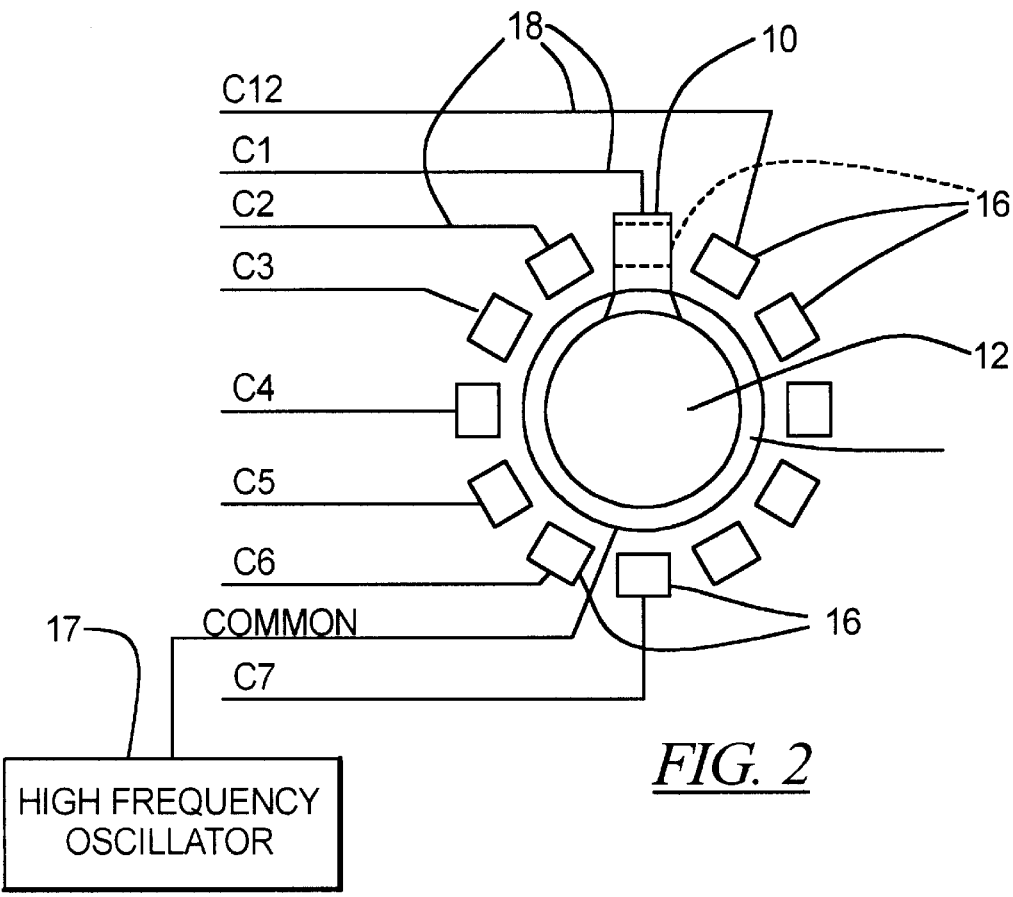
FIG. 2 shows a first embodiment of a regulating arrangement and a contact arrangement.

The salient point in this instance is that the first plate 2A has no openings, so no fluid is able to leak into other plates in the panel 2. As FIGS. 1 and 2 show, a mechanical user interface is built into the apparatus panel 2. The mechanical user interface includes a knob 6, a seat 8, an indicator 10 and a first contact plate 12 arranged on the exterior of the first plate 2A, as well as a second contact plate 14 and a number of contact surfaces 16 arranged on the third plate 2C. Components on the exterior of the first plate 2A constitute a regulating arrangement, and components on the third plate 2C constitute a contact arrangement.

The contact surfaces 16 are concentrically arrayed around the second contact plate 14, and some of them are connected by conductors 18 to different sockets C1–C8. The second contact plate 14 is connected by a conductor 18 to a common socket for all contact surfaces 16. The first contact surface 12 is located immediately above the second contact plate 14, and the indicator 10 can be positioned over an optional contact surface 16 by a rotating the knob 6. The position of the indicator 10 can be identified when capacitance is read. Alternatively, the current emitted by a high-frequency oscillator 17 can be used for this identification. In other words, settings are achieved with the aid of a capacitively coupled circuit. When the position has been identified, action, corresponding to that position, can be ordered by a control unit (not shown) or the equivalent for the apparatus to which the apparatus panel 2 connected. The action can be entering into an operating mode, making a parameter choice, selecting a parameter value or something else.

Figure 3:
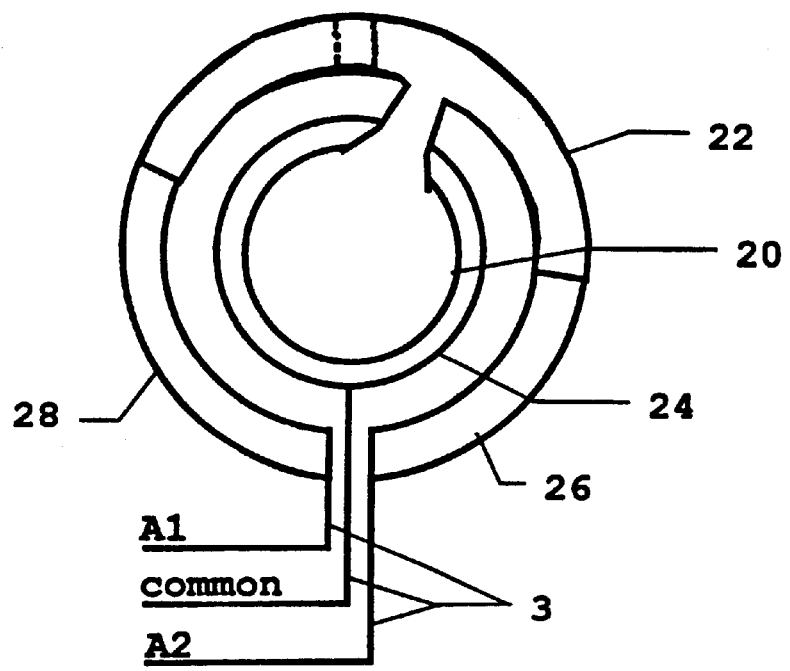
FIG. 3 shows a second embodiment of a regulating arrangement and a contact arrangement.

The embodiment of the mechanical user interface shown in FIGS. 1 and 2 entails incremental or discrete reading of the position of the indicator 10. FIG. 3 shows an alternative design providing differential or continuous reading.

Only relevant parts of the mechanical user interface are shown in FIG. 3. A first contact plate 20 is connected to an indicator 22, which has an elongated semicircular shape. As in the previous example, they are located on the first plate of the apparatus panel. A second contact plate 24 and two semicircular contact surfaces 26, 28 are under the first contact plate 20 on the third plate. The two semicircular contact surfaces 26, 28 are connected by the conductors 30 to respective sockets A1, A2, and the second contact plate 24 is connected by a wire 30 to a common socket.

In this example, capacitance is determined across the respective sockets A1, A2 and the common socket. Depending on the knob setting and, accordingly, the position o the indicator 22 above the contact surfaces 26, 28, measured capacitance will vary in a specific manner unique to each knob position.

Figure 4:
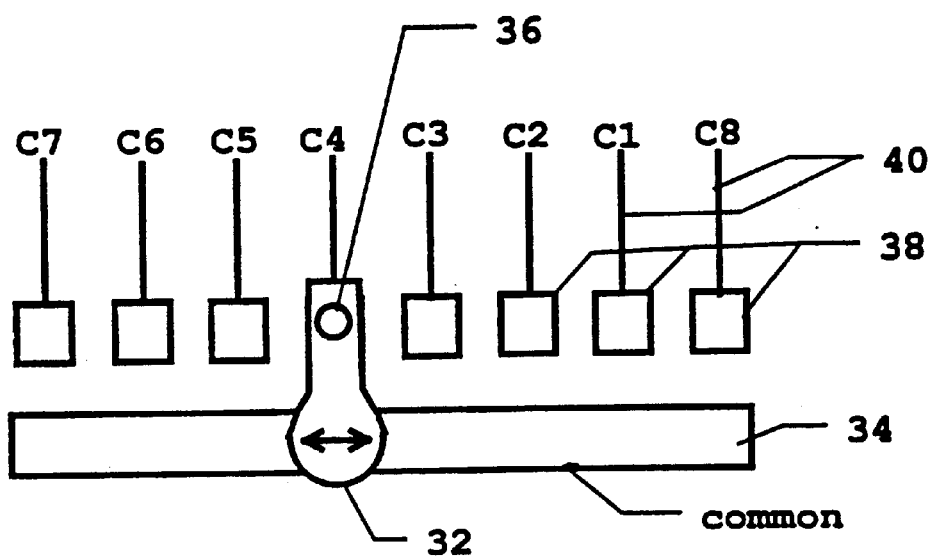
FIG. 4 shows a third embodiment of a regulating arrangement and a contact arrangement.

FIG. 4 shows a third version of a mechanical user interface. As in the embodiments according to FIGS. 1 and 2, FIG. 4 depicts a discrete or incremental system. Like the example in FIG. 3, FIG. 4 only shows basic components for functioning according to the invention.

An indicator 32 is slidingly arranged on a rail 34 on the exterior of the apparatus panel. A permanent magnet 36 is attached to the indicator 32. A number of contact surfaces 38 are arranged parallel to the rail 34 on the third plate. The contact surfaces 38 are connected by the conductors 40 to the respective socket C1–C8. The magnet is detected when the indicator 32 is moved along the rail 36, causing a contact surface 38 to end up under the permanent magnet 36, and a signal is generated at the relevant socket C1–C8 (causing a signal to be generated at the socket C4 at the position shown by the indicator 32 in FIG. 4).

A number of variations of the described embodiments are possible with touchfree contact. For example, combinations of discrete and continuous sensing can be used. Optical and acoustical systems can also be utilized instead of capacitive and magnetic systems.

In an optical system, a light-emitting diode on the indicator can be used, and light detectors can be arranged to sense the indicator's position. The risk of interference from ambient light can be minimized with a suitable choice of light-emitting diode and filters for the light detectors. Light can also be varied i na significant fashion, e.g. by changing intensity or blinking at a specific rate in order to completely eliminate such interference.

In a corresponding fashion, an acoustical system can include e.g. an ultrasonic transmitter and receiver and generate unique signals. The position of the indicator can correspond to a special frequency or modulation of the acoustic signal. Therefore one receiver may then be sufficient for continuous sensing of the position of the indicator.

The ability to arrange a number of contacts (e.g. contact surfaces) on different parts of the third plate and (transparent) holders for the knob or other controls on the first plate are other advantages. A single knob then can be moved to different parts of the apparatus panel, as needed, to adapt the apparatus panel to the displayed information. All the components in the panel should be transparent to avoid obscuring the screen (or background) behind it.

Although modifications and changes may be suggested by those skilled in the art, it is the intention of the inventor to embody within the patent warranted hereon all changes and modifications as reasonably and properly come within the scope of his contribution to the art.

I claim as my invention:

1. An apparatus panel for at least partial placement in front of an indicia-carrying surface, said apparatus panel comprising:

at least two stacked, transparent panel plates;

a mechanical user interface comprising at least one mechanically operated regulating arrangement and a corresponding contact arrangement, said regulating arrangement and said contact arrangement being physically separated by one of said panel plates, and said regulating arrangement being settable into a position among a plurality of different positions; and said regulating arrangement and said contact arrangement comprising means for sensing a position of said regulating arrangement without physical contact between said regulating arrangement and said contact arrangement for causing said contact arrangement to produce a contact corresponding to a setting of said mechanical user interface.

2. An apparatus panel as claimed in claim 1 wherein said regulating arrangement is detachably connected to an exterior one of said panel plates, and wherein said contact arrangement comprises a plurality of groups of contact elements disposed at respectively different parts of another of said panel plates, said regulating arrangement being selectively positionable over any one of said group of contact elements.

3. An apparatus panel as claimed in claim 1 wherein said regulating arrangement comprises an indicator and a knob for mechanically changing a position of said indicator, and wherein said contact arrangement comprises a surface capacitively coupled to said indicator for sensing the position of said indicator.

4. An apparatus panel as claimed in claim 3 wherein said contact arrangement comprises a plurality of uniformly sized surfaces respectively capacitively coupleable to said indicator, and wherein said indicator has a surface which is a same size as said surfaces of said contact arrangement, said surfaces of said contact arrangement incrementally sensing the position of said indicator.

5. An apparatus panel as claimed in claim 3 wherein said contact arrangement comprises two uniformly sized and shaped surfaces capacitively coupleable to said indicator, and wherein said indicator has a size and shape equal to the size and shape of said two surfaces of said contact arrangement, said contact arrangement differentially and capacitively sensing the position of said indicator.

6. An apparatus panel as claimed in claim 1 wherein said regulating arrangement comprises an indicator composed of magnetic material and a knob for mechanically changing a position of said indicator, and wherein said contact arrangement comprises means magnetically coupled to said indicator for sensing the position of said indicator.

7. An apparatus panel as claimed in claim 1 wherein said regulating arrangement comprises an indicator and a knob for mechanically changing a position of said indicator, and wherein said contact arrangement comprises at least one surface optically coupled to said indicator for sensing the position of said indicator.

8. An apparatus panel as claimed in claim 1 wherein said regulating arrangement comprises an indicator and a knob for mechanically changing a position of said indicator, and wherein said contact arrangement comprises at least one surface acoustically coupled to said indicator for sensing the position of said indicator.

* * * * *